United States Patent
Best et al.

(10) Patent No.: US 6,882,593 B2
(45) Date of Patent: Apr. 19, 2005

(54) ADJUSTABLE CLOCK DRIVER CIRCUIT

(75) Inventors: Scott C. Best, Palo Alto, CA (US); Frank Lambrecht, Mountain View, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 10/455,059

(22) Filed: Jun. 4, 2003

(65) Prior Publication Data

US 2004/0246811 A1 Dec. 9, 2004

(51) Int. Cl.$^7$ .................................................. G11C 8/00
(52) U.S. Cl. ......................................... 365/233; 365/148
(58) Field of Search ................................. 365/233, 148

(56) References Cited

U.S. PATENT DOCUMENTS

| | | | |
|---|---|---|---|
| 6,192,005 B1 | 2/2001 | Lee | 365/233 |
| 6,573,746 B1 * | 6/2003 | Kim et al. | 326/30 |
| 2001/0035768 A1 | 11/2002 | Garlepp et al. | 326/83 |
| 2003/0231523 A1 * | 12/2003 | Cho et al. | 365/189.05 |

OTHER PUBLICATIONS

Gabara, T.J., et al., "Digitally Adjustable Resistors in CMOS for High–Performance Applications," IEEE J. of Solid–State Circuits, vol. 27, No. 8, Aug. 1992, pp. 1176–1185.
PCT International Search Report, International Application No. PCT/US2004/018226, International Filing Date—Mar. 6, 2004, dated Sep. 13, 2004.

* cited by examiner

Primary Examiner—Michael S. Lebentritt
Assistant Examiner—Tuan T. Nguyen
(74) Attorney, Agent, or Firm—Morgan, Lewis & Bockius LLP

(57) ABSTRACT

A circuit for generating a clock signal to driver a plurality of memory components in a memory subsystem. The clock driver circuit comprises a clock generator for transmitting a clock signal to drive the plurality of memory components, a memory controller for controlling the plurality of memory components, and an adjustable impedance circuit residing within said memory controller such that the adjustable impedance circuit is programmable in accordance with a control input generated by the memory controller. The clock generator is configured to generate a clock signal with a voltage swing controlled by the impedance of the adjustable impedance circuit.

14 Claims, 4 Drawing Sheets

ADJUSTABLE CLOCK DRIVER CIRCUIT

FIELD OF THE INVENTION

The present invention relates to the field of electronic circuits, and in particular to clock generator circuits for driving clock signal lines in high-speed digital systems.

BACKGROUND OF THE INVENTION

In a digital system, a reference clock may be used to synchronize communications between components. The reference clock signal may be generated by a clock generator, which may be a standalone component in the digital system. FIG. 1 illustrates a clock driver circuit design in a memory subsystem. The memory subsystem includes a memory controller 102, a plurality of dynamic random access memories (DRAMs) 104, a clock generator 110 which utilizes a reference resistor $R_{ref}$ 112, and a clock line 106 which is connected to a termination voltage $V_t$ 114 through a termination resistor $R_t$ (or more generally a resistive termination network 108). In the example memory subsystem shown in FIG. 1, the clock line 106 includes a conductor that passes through the memory controller 102 such that the conductor is divided into two portions: a clock-to-master (CTM) portion and a clock-from-master (CFM) portion. The memory controller 102 is the master device in the system. The CTM portion propagates the clock signal from the clock generator 110 towards the memory controller 102. The CFM portion propagates the clock signal from the memory controller 102 towards the DRAMs 104. The DRAMs 104 are connected to both CTM and CFM portions of the clock line. The clock line 106 is divided in this manner so that the clock signal can maintain a specific phase relationship with data signals (not shown) that are transmitted between the DRAMs 104 and the memory controller 102 as the signals propagate, regardless of whether the data signals are transmitted from the DRAMs to the memory controller or vice versa.

FIG. 2 is a waveform illustrating the clock signal generated by the clock generator 110 (also called a clock driver circuit) of FIG. 1 as a function of time. The example clock signal has a high voltage level $V_{OH}$, a low voltage level $V_{OL}$, and a midpoint centered around $V_{ref}$. The clock signal is converted into an internal clock signal for use within the DRAMs by circuitry (not shown) within the DRAMs. The circuitry generates the internal clock signal by comparing the voltage of the clock signal with the reference voltage $V_{ref}$.

In typical clock generators, the reference resistor $R_{ref}$ 112 determines the amplitude of the output signal. As the clock signal is used by all components of the system as a precise timing reference, the precision of the $R_{ref}$ is critical in a memory subsystem design. Therefore, the $R_{ref}$ usually resides outside the clock generator because it is more cost effective to achieve a precise resistance value using a standalone resistor as opposed to implementing the $R_{ref}$ resistor on chip.

From a system perspective, the optimal amount of voltage swing depends on the number of DRAM devices on the reference clock network, since each DRAM device is a load to the reference clock signal. For example, a clock generator supplying the reference clock for a 32-device memory channel should preferably drive a larger output swing to overcome signal attenuation in the channel than it would need to for a memory channel that has only 16 devices loading the reference clock lines. The larger voltage swing in the long channel improves the voltage margin at the expense of the increased power.

One of the problems of the clock driver circuit illustrated in FIG. 1 is that the voltage swing of the clock generator is fixed for a given configuration of DRAM devices in the memory subsystem. That is, the precision reference resistor $R_{ref}$ is tuned to operate with a certain memory configuration at a certain clock frequency. This reference resistor is fixed on the circuit board after it is tuned to operate with the memory topography at a particular clock frequency. However, if it is desired to change the memory topography of an existing memory subsystem, the existing clock signal would not produce an optimal voltage swing for the new memory subsystem. For example, if more DRAM devices are added to the memory configuration, the load on the output of the clock generator 110 would increase. Hence, the clock signal quality received at the DRAM devices would suffer because of the attenuation caused by the additional loads. On the other hand, if a number of DRAM devices are removed from the memory configuration, the load of the clock circuit would decrease. Hence, the clock generator would drive a larger voltage swing to the clock signal line due to the reduction in the number of loads. This increase in voltage swing unnecessarily consumes more power.

In view of the shortcomings of the systems described above, it is an objective of the present invention to provide a clock driver circuit that adjusts its drive strength in response to a change in clock frequency of the memory subsystem. It is another objective of the present invention to provide a clock driver circuit that adjusts its drive strength in response to a change in memory configuration of the memory subsystem. More generally, it is an objective of the present invention to provide a clock driver circuit that generates a signal on a clock line with these characteristics.

SUMMARY OF THE INVENTION

In summary, the present disclosure discloses a circuit for generating a clock signal to drive a plurality of memory components in a memory subsystem. The clock driver circuit comprises a clock generator for transmitting a clock signal to drive the plurality of memory components, a memory controller for controlling the plurality of memory components, and an adjustable impedance circuit residing within said memory controller such that the adjustable impedance circuit is programmable in accordance with a control input generated by the memory controller. The clock generator is configured to generate a clock signal with a voltage swing controlled by the impedance of the adjustable impedance circuit.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

DESCRIPTION OF THE PREFERRED EMBODIMENTS

Figure 1:
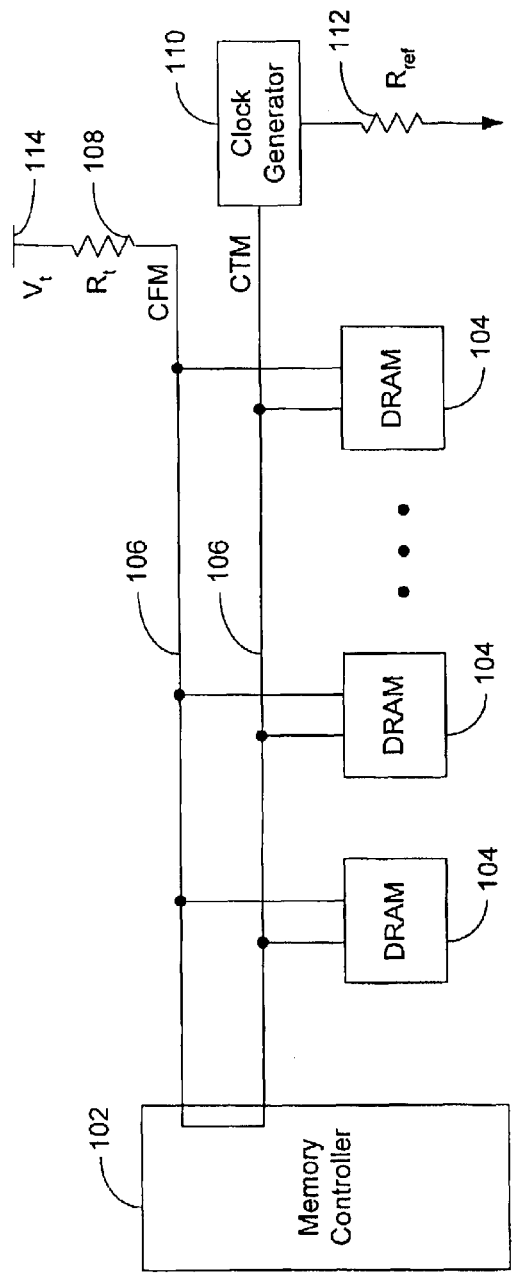
FIG. 1 illustrates a clock driver circuit design in a memory subsystem.
Figure 2:
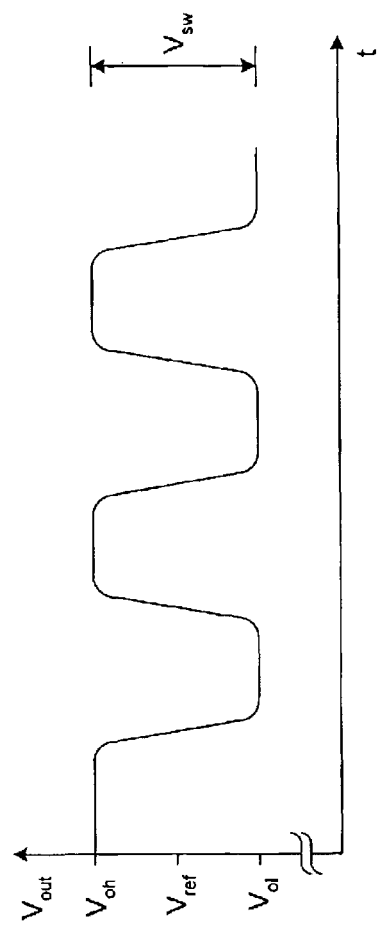
FIG. 2 is a waveform illustrating the clock signal generated by the clock driver circuit of FIG. 1 as a function of time.
Figure 3:
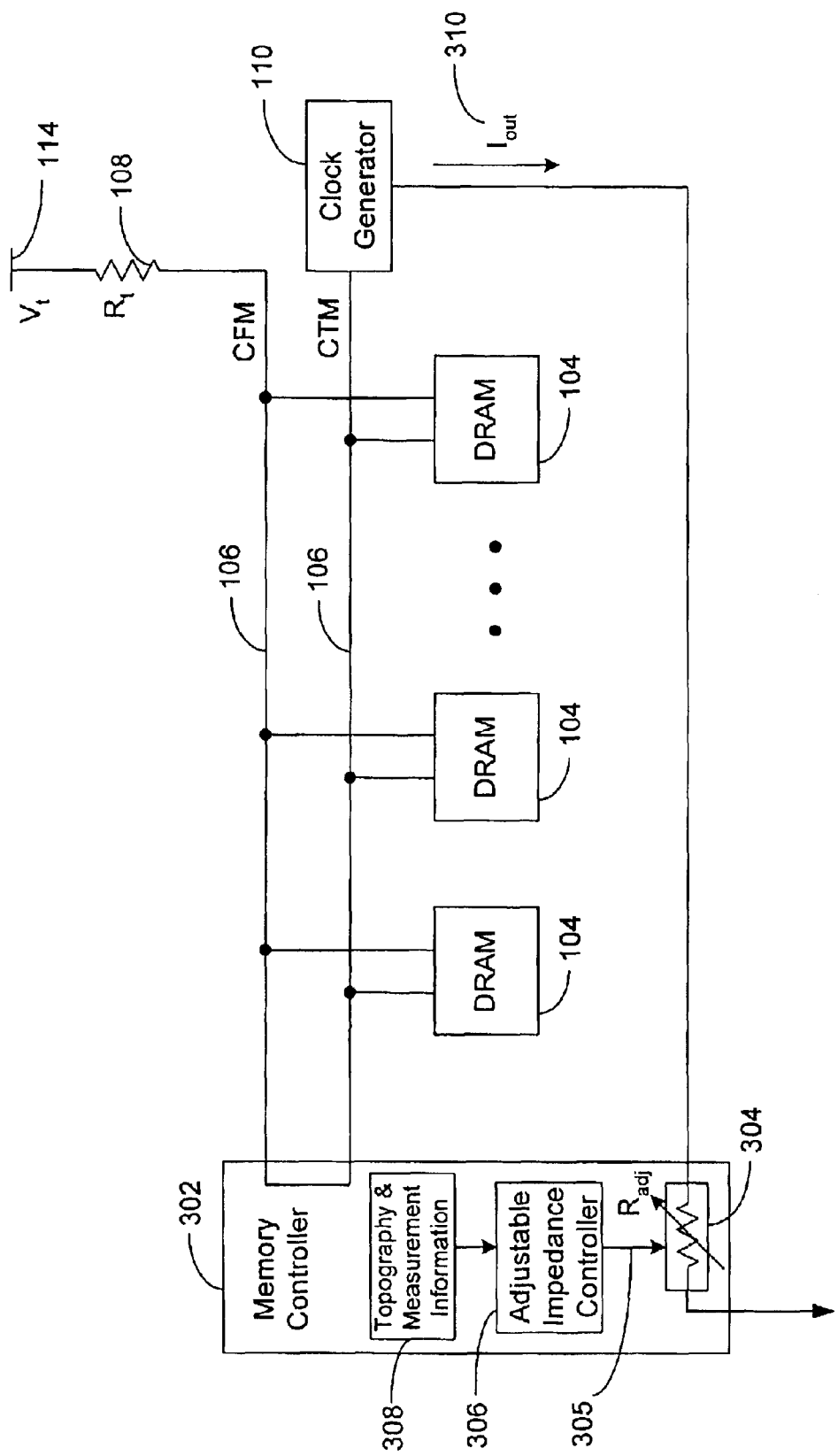
FIG. 3 illustrates an adjustable clock driver circuit in a memory subsystem.

FIG. 3 illustrates a preferred embodiment of an adjustable clock driver circuit in a memory subsystem in accordance with the present invention. The memory subsystem includes a memory controller 302, a plurality of dynamic random access memories (DRAMs) 104, a clock generator chip 110, and a clock line 106 which is connected to a termination voltage $V_t$ 114 through a termination resistor $R_t$ 108 (or more generally a resistive termination network). The memory controller 302 includes an adjustable impedance circuit 304, an adjustable impedance controller 306, and circuitry 308 for storing topography and measurement information. The adjustable impedance circuit 304 has one terminal connected to the clock generator 110 and the other terminal connected to a reference voltage such as circuit ground. The impedance of the adjustable impedance circuit 304 is programmable by an impedance control signal 305 generated by the adjustable impedance controller 306. The topography and measurement information storage circuitry 308 may be implemented as a memory component for storing topography information for the memory subsystem and measurement information of the clock signal generated by the clock generator 110. The topography information of a memory subsystem may include the number of memory devices, the system clock speed, parameters of the clock generator, and other information.

The output amplitude of the clock driver is typically inversely proportional to the impedance of the adjustable impedance circuit 304. Via the arrangement shown in FIG. 3, the voltage swing of the clock signal can be controlled by adjusting the impedance of the adjustable impedance circuit 304. In another embodiment, the adjustable impedance circuit can be placed in series, in parallel or in series-parallel combination to one or more external reference resistors. The resultant combined impedance is controllable by adjusting the impedance control circuit 304.

Figure 4:
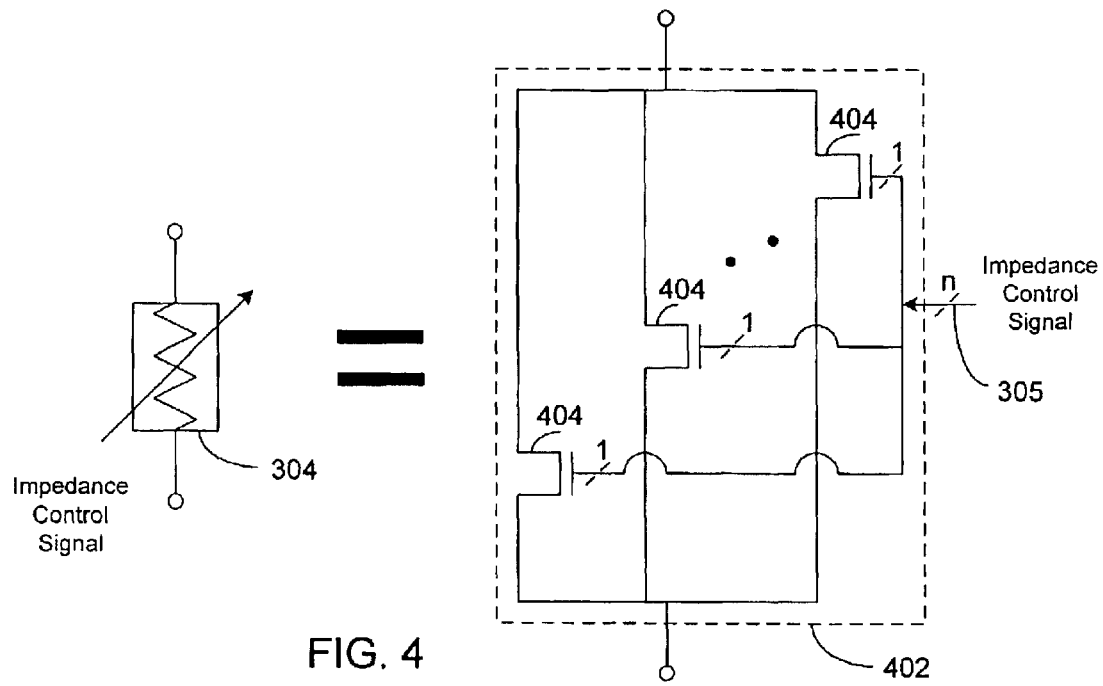
FIG. 4 illustrates an exemplary implementation of the adjustable impedance circuit of FIG. 3.

FIG. 4 illustrates one approach to implement the adjustable impedance circuit 304. The adjustable impedance circuit 304 can be implemented as a group of n transistors 404 connected in parallel with each other, shown as circuit 402 in FIG. 4, where n is an integer greater than one. The drain terminals of the transistors 404 are connected together and the source terminals of the transistors 404 are connected together. Each of the gate terminals of the n transistors 404 is coupled to a corresponding bit of input impedance control signal 305, of a set of n binary control signals. The impedance of each individual transistor 404 is adjusted by turning on or off the corresponding one of the binary control signals. The total impedance of the group of transistors is the resultant impedance of the transistors 404 in parallel.

Figure 5B:
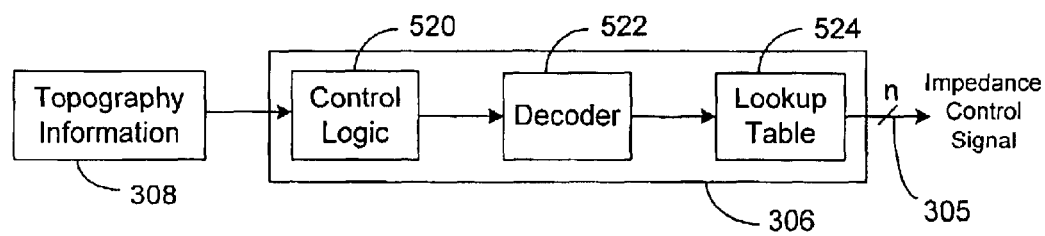
FIG. 5B illustrates one approach for determining the initial adjustable impedance value.
Figure 5C:
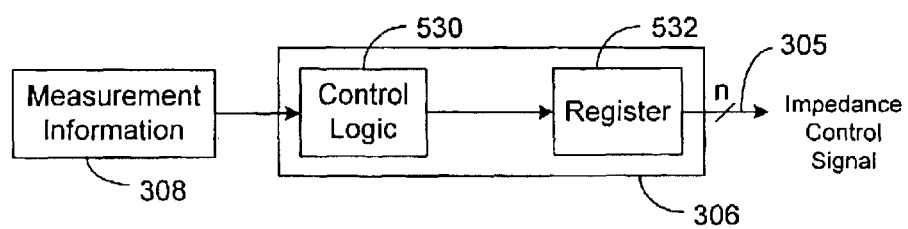
FIG. 5C illustrates one approach for determining the fine tuned adjustable impedance value.
Figure 5A:
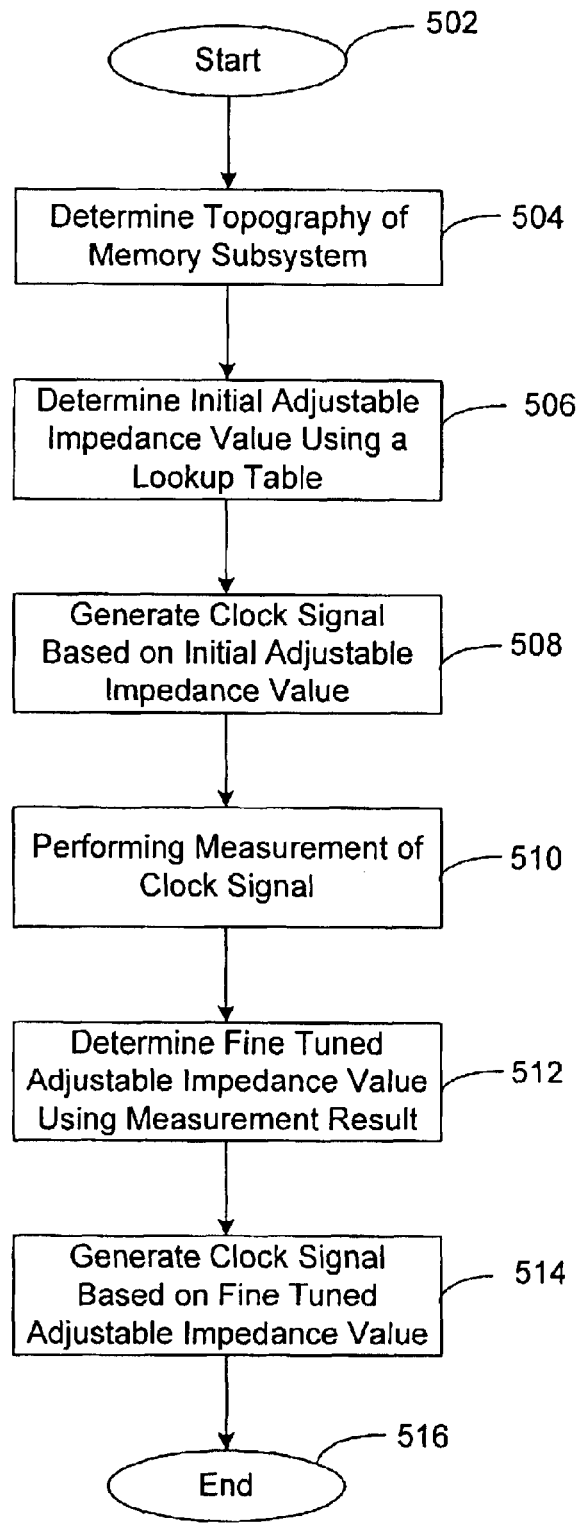
FIG. 5A illustrates a method for adjusting the impedance of the adjustable impedance circuit.

FIG. 5A illustrates a method for adjusting the impedance of the adjustable impedance circuit. The method starts in step 502 and then moves to step 504 where the topography information of the memory subsystem is determined and retrieved. The topography information is pre-programmed to the memory controller 302 prior to a memory access. In another embodiment of the invention, the central processing unit (CPU), which also has the topography information of the memory subsystem can be accessed to retrieve the topography information. Alternately, the memory controller may query the memory modules on the memory bus 106 to determine at least some of the topography information, such as the number of memory devices on the bus, the load on the bus presented by each memory device (or other information which enabled the memory controller to infer the load presented each memory device), etc.

In step 506, an initial adjustable impedance value is determined using a lookup table (524, FIG. 5B). The lookup table accessed by the memory controller stores a series of predetermined default adjustable impedance values to be used with certain memory topographies. Next in step 508, the clock driver circuit generates a clock signal based on the initial adjustable impedance value determined in step 506.

In step 510, various parameters of the clock signal generated in step 508 are measured. The measurements may include measurement of attenuation of the clock signal at the memory controller, temperature measurement during operation, and may also in some include measurement of other characteristics of the system. These measurements may be obtained by a closed-loop feedback system (not shown) within the memory controller which monitors the voltage swing of the clock signal detected at the input of the memory controller. In yet other embodiments, the memory devices may be configured, or additional equipment may be used to measure attenuation of the clock signal at one or more of the memory devices. In step 512, a fine tuned adjustable impedance value is determined in response to the measurement results obtained in step 510. For example, if the voltage swing of the clock signal suffers attenuation at the input of a memory device, the drive strength of the clock driver circuit is adjusted higher by reducing the impedance of the adjustable impedance circuit. Or if the voltage swing of the clock signal is too high at the input of a memory device, the drive strength of the clock driver circuit is adjusted lower by increasing the impedance of the adjustable impedance circuit. In step 514, a new clock signal is generated based on the fine tuned adjustable impedance value determined in step 512. Steps 510, 512 and 514 may be repeated until a desired clock signal is achieved. The method ends in step 516.

FIG. 5B illustrates one approach for determining the initial adjustable impedance value by the adjustable impedance controller 306 in step 506 of FIG. 5A. The adjustable impedance controller 306 includes a control logic block 520, a decoder 522 and a lookup table 524. The control logic 520 receives topography information from a memory or other device 308. Based on the topography information received, the control logic 502 computes an address for the decoder block 522. The decoder 522 decodes the address and determines a specific location in a lookup table 524, where a predetermined impedance control signal 305 is stored. This impedance control signal is in turn used to control the adjustable impedance circuit 304 to generate an adjustable impedance value.

FIG. 5C illustrates one approach for determining the fine tuned adjustable impedance value by the adjustable impedance controller 306 in step 512 of FIG. 5A. In this approach, the adjustable impedance controller 306 includes a control logic circuit 530 and a register 532. The control logic 530 receives measurement information from a memory or other device 308. The measurement information includes the attenuation of the clock signals at one or more of the memory devices, and may also include the temperature variation during operation and other information. Based on the information received from device 308, the control logic 530 computes a set of control signals which are stored in the register 532. The output of the register 532 is the impedance control signal 305. This impedance control signal is in turn used to control the adjustable impedance circuit 304 to generate an adjustable impedance value.

The disclosed clock driver circuit provides at least five advantages for the improved memory subsystem. First, it ensures clock signal quality by adjusting clock driver voltage swing in response to memory topography and clock signal measurement information. For instance, it is capable of generating a larger voltage swing for a heavily loaded memory channel where trace and connector transitions cause serious attenuation of the clock signal received at the memory devices. Second, it saves power by reducing the driver voltage swing for a lightly loaded memory channel. Third, it provides a user the ability to make a power consumption and clock signal quality trade-off by increasing the voltage swing and hence the power consumption to guarantee a better clock signal quality or by reducing the voltage swing and hence the signal quality to ensure a lower power consumption. Fourth, it reduces the cost the precision reference resistor 112 with a group of essentially free transistors in the memory controller. (The transistors 404, FIG. 4, are virtually free because the memory controller is typically implemented on an integrated circuit and the incremental cost of few additional transistors on an integrated circuit is virtually zero.) Fifth, the clock driver circuit can be employed in a system where memory modules of various speed grades are used.

One skilled in the relevant art will easily recognize that various modifications of the disclosure can work well for the inventive clock driver circuit while preserving the spirit of the present invention. For example, the adjustable impedance controller and the adjustable impedance circuit can reside in a device (or more than one device) other than the memory controller in the memory subsystem.

The foregoing description, for purpose of explanation, has been described with reference to specific embodiments. However, the illustrative discussions above are not intended to be exhaustive or to limit the invention to the precise forms disclosed. Many modifications are variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit for generating a clock signal to drive a plurality of memory components in a memory subsystem, comprising:
    a clock generator for transmitting a clock signal to drive said plurality of memory components;
    a memory controller for controlling said plurality of memory components; and
    an adjustable impedance circuit having a first terminal coupled to said clock generator and a second terminal coupled to a circuit ground, wherein said adjustable impedance circuit having an impedance programmable in accordance with a control input generated by said memory controller;
    wherein the clock generator is configured to generate the clock signal at an amplitude controlled by the impedance of said adjustable impedance circuit.

2. The circuit of claim 1, wherein said adjustable impedance circuit resides within said memory controller.

3. The circuit of claim 1, wherein the clock generator is configured to drive the clock signal with an amount of current controlled by the impedance of said adjustable impedance circuit.

4. The circuit of claim 1, wherein said memory controller is configured to determine a topography of a system that includes the memory controller and the plurality of memory components and is further configured to generate the control input in accordance with the determined topography.

5. The circuit of claim 1, wherein said clock generator is coupled to a power supply through a terminating resistor.

6. The circuit of claim 1, wherein said clock signal is a pair of differential clock signals.

7. An electronic system for generating a clock signal to drive a plurality of memory components in a memory subsystem, comprising:
    a clock generator for transmitting a clock signal to drive said plurality of memory components;
    a memory controller for controlling said plurality of memory components; and
    an adjustable impedance circuit having a first terminal coupled to said clock generator and a second terminal coupled to circuit ground, wherein said adjustable impedance circuit having an impedance programmable in accordance with a control input generated by said memory controller;
    wherein the clock generator is configured to generate the clock signal at an amplitude controlled by the impedance of said adjustable impedance circuit.

8. The electronic system of claim 7, wherein said adjustable impedance circuit resides within said memory controller.

9. The electronic system of claim 7, wherein the clock generator is configured to drive the clock signal with an amount of current controlled by the impedance of said adjustable impedance circuit.

10. The electronic system of claim 7, wherein said memory controller is configured to determine a topography of a system that includes the memory controller and the plurality of memory components and is further configured to generate the control input in accordance with the determined topography.

11. The electronic system of claim 7, wherein said clock generator is coupled to a power supply through a terminating resistor.

12. The electronic system of claim 7, wherein said clock signal is a pair of differential clock signals.

13. A method for configuring a clock generator in a memory subsystem, comprising:
    determining a topography of the memory subsystem;
    determining an adjustable impedance value of a clock generator in accordance with the determined topography; and
    driving a clock signal on a clock bus with an amount of current determined by the adjustable impedance value.

14. The method of claim 13, wherein the adjustable impedance value is determined by:
    performing a table look up, base on the determined topography, to obtain an initial adjustable impedance value;
    driving the clock signal in accordance with the initial adjustable impedance value;
    performing a measurement with respect to the clock signal;
    determining a fine tuned adjustable impedance value in accordance with the measurement; and
    driving the clock signal in accordance with the fine tuned adjustable impedance value.

* * * * *